United States Patent
Kasori et al.

[11] Patent Number: 6,110,596
[45] Date of Patent: *Aug. 29, 2000

[54] SILICON NITRIDE CERAMIC CIRCUIT SUBSTRATE AND SEMICONDUCTOR DEVICE USING THE SAME

[75] Inventors: Mitsuo Kasori; Akihiro Horiguchi, both of Kanagawa-ken; Hiroyasu Sumino; Fumio Ueno, both of Tokyo, all of Japan

[73] Assignee: Kabushiki Kaisha Toshiba, Kawasaki, Japan

[ * ] Notice: This patent issued on a continued prosecution application filed under 37 CFR 1.53(d), and is subject to the twenty year patent term provisions of 35 U.S.C. 154(a)(2).

[21] Appl. No.: 08/721,346
[22] Filed: Sep. 26, 1996

[30] Foreign Application Priority Data

Sep. 28, 1995 [JP] Japan ................................. 7-250317
Mar. 26, 1996 [JP] Japan ................................. 8-070012

[51] Int. Cl.⁷ ................................................ C04B 35/58
[52] U.S. Cl. ...................... 428/428; 501/97.1; 501/97.4; 428/432; 428/336; 428/216; 428/469; 428/472; 428/697; 428/698; 428/699; 228/122
[58] Field of Search .......................... 428/698, 469, 428/472, 216, 697, 699, 701, 702, 336, 428, 432; 501/97.1, 97.4; 228/122

[56] References Cited

U.S. PATENT DOCUMENTS

| | | |
|---|---|---|
| 4,540,462 | 9/1985 | Mizunoya et al. ................. 156/630 |
| 4,608,354 | 8/1986 | Avella et al. ................. 501/97 |
| 4,647,477 | 3/1987 | DeLuca ................. 228/209 |
| 4,849,292 | 7/1989 | Mizunoya et al. ................. 428/469 |
| 5,100,714 | 3/1992 | Zsamboky ................. 428/698 |
| 5,176,309 | 1/1993 | Horiguchi et al. ................. 228/122 |
| 5,280,850 | 1/1994 | Horiguchi et al. ................. 228/122.1 |
| 5,399,536 | 3/1995 | Yamakawa et al. ................. 501/97 |

FOREIGN PATENT DOCUMENTS 761045   11/1956   United Kingdom .

OTHER PUBLICATIONS

Tsuge and Nishida, "High Strength Hot–Pressed $Si_3N_4$ with Concurrent $Y_2O_3$ and $Al_2O_3$ Additions", Ceramic Bulletin, vol. 57, No. 4, 1978, pp. 424–431.

Tanaka et al, "Surface Characteristics of Metal Bondable Silicon Nitride Ceramics", Proc. of International Symposium on Ceramic Components for Engine, Japan, 1993, pp. 249–256.

Primary Examiner—Archene Turner
Attorney, Agent, or Firm—Foley & Lardner

[57] ABSTRACT

Disclosed are a circuit substrate which comprises a silicon nitride ceramic plate 1 having a thermal conductivity at room temperature of 80 W/mK or more and a metal plate 2 joined to the silicon nitride ceramic plate 1 through a glass layer 3, and a semiconductor device in which the circuit substrate is mounted.

18 Claims, 1 Drawing Sheet

SILICON NITRIDE CERAMIC CIRCUIT SUBSTRATE AND SEMICONDUCTOR DEVICE USING THE SAME

BACKGROUND OF THE INVENTION

1. Field of the invention

This invention relates to a silicon nitride circuit substrate and a semiconductor device in which a semiconductor element(s) is mounted on said substrate, particularly to a circuit substrate having excellent mechanical strength, heat cycle resistance and radiation characteristic.

2. Prior art

An electronic circuit mainly comprises an element such as IC, a substrate, a wiring and the like. In recent years, an electronic circuit has been speeded up, downsized and rendered large output possible, and the calorific value of an element has been a large value which cannot be ignored. In order to cope with such a situation, as a substitute for a conventional ceramic substrate, there have been developed, for example, aluminum nitride (AlN) having high thermal conductivity and a glass+ceramic substrate having a low dielectric constant.

Here, a substrate comprising aluminum nitride has excellent radiation property, but the substrate has a relatively high dielectric constant, and sintering temperature is high. Therefore, a conductive component is limited to a metal having a high melting point and relatively low conductivity such as W and Mo, and it has been desired to lower the dielectric constant of the substrate and the resistance of a wiring material.

Further, the thermal expansion coefficient is about $4.5 \times 10^{-6}/°$ C. which is smaller than that of alumina ceramics which is a conventional circuit substrate, so that at the time of metallization, breaking of ceramics is caused by mismatching of thermal expansion coefficients, whereby there is a problem of lowering reliability of a device using the substrate. On the other hand, a substrate comprising glass and ceramics has a low dielectric constant, and sintering temperature is low, so that it has a characteristic that a metal having a low melting point and high conductivity such as Au, Ag and Cu can be used as a wiring material. However, the substrate has a drawback that thermal conductivity and mechanical strength are low.

Further, as a novel circuit substrate, silicon nitride ceramics has been investigated in recent years. Silicon nitride has excellent mechanical characteristics such as flexural strength and toughness. Particularly, even at a high temperature of 1,000° C. or higher, lowering of strength is small, and corrosion resistance is excellent, so that silicon nitride has been highlighted as a high temperature and high strength material such as a member for a gas turbine and an engine member. In the prior art, silicon nitride has been considered to be unsuitable for a circuit substrate because of low thermal conductivity thereof. However, in recent years, as disclosed in, for example, Japanese Provisional Patent Publication No. 135771/1994, improvement of thermal conductivity of silicon nitride ceramics has progressed, and silicon nitride ceramics having a thermal conductivity of about 120 W/mK has been obtained.

SUMMARY OF THE INVENTION

As described above, the mechanical strength and thermal conductivity of a ceramic plate itself have been improved. However, it is required to increase the mechanical strength of a whole circuit substrate or a whole semiconductor device, particularly the joining strength between a ceramic plate and a metal plate and also improve heat cycle resistance.

The present inventors have found that the above task can be achieved by joining a metal plate through a glass layer to a silicon nitride ceramic plate having a thermal conductivity at room temperature of 80 W/mK or more. The glass layer is an oxide glass layer, an oxynitride glass layer, a crystallized glass layer or a glass layer being included in these plural concepts. As a preferred embodiment, the glass layer contains 0.01 to 2% by weight of an alkali metal, 0.01 to 5% by weight of a transition metal and 0.02 to 2.5% by weight of aluminum oxide, all of which are calculated on oxide. When an oxynitride glass layer is selected as the glass layer, the amount of nitrogen in the glass is preferably 0.05 to 7% by weight.

As described above, by joining a silicon nitride ceramic plate having excellent mechanical strength and thermal conductivity and a conductive metal such as copper and aluminum through a glass layer, the joining strength of a circuit substrate can be enlarged, and also heat cycle resistance can be improved. Such a circuit substrate has low wiring resistance and is suitable for a substrate for a high-speed circuit and a substrate for large power. Thus, the reliability of a semiconductor device using the circuit substrate of the present invention can be improved significantly.

DESCRIPTION OF THE PREFERRED EMBODIMENTS

Figure 1:
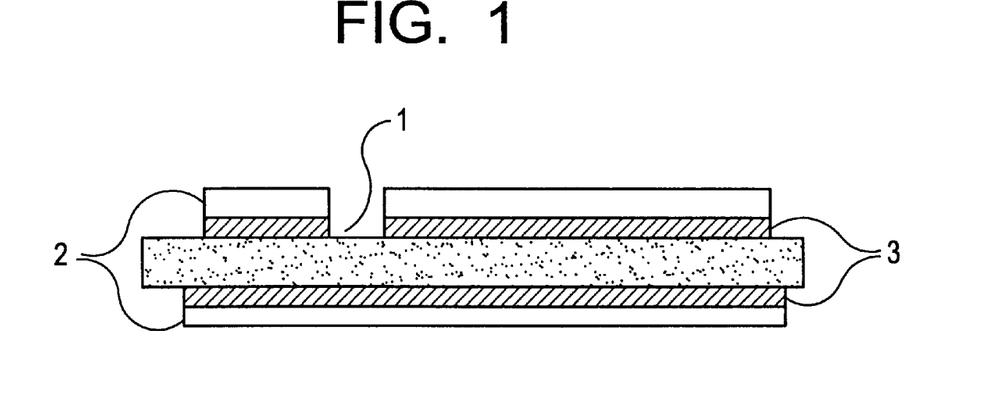
FIG. 1 is a conceptional view of a silicon nitride ceramic circuit substrate.

First, the circuit substrate of the present invention is explained by referring to FIG. 1.

As the silicon nitride ceramic plate 1 to be used in the present invention, a ceramic plate having a thermal conductivity at room temperature of 80 W/mK or more is used. A ceramic plate having such a characteristic has been disclosed in Japanese Provisional Patent Publication No. 135771/1994 and can be obtained by heightening the ratio of a crystal phase in a grain boundary phase of silicon nitride ceramics to about 40% by volume. A specific preparation method thereof is described below.

Next, as the metal plate 2 to be used in the present invention, preferably a metal exhibiting large electric conductivity is used. Such a metal includes, for example, copper, aluminum and nickel.

The glass layer 3 to be used in the present invention is an oxide glass layer, an oxynitride glass layer, a crystallized glass layer or a glass layer being included in these plural concepts.

With respect to the oxide glass layer, a main composition system thereof is not limited, and there may be mentioned, for example, $SiO_2$ type, $SiO_2$—$B_2O_3$ type, $P_2O_5$ type and mixed type glasses.

With respect to the oxynitride glass layer, a main composition system thereof is not limited, and there may be mentioned, for example, $SiO_2$ type, $SiO_2$—$B_2O_3$ type, $P_2O_5$ type and mixed type glasses, into which a predetermined amount of nitrogen is introduced.

A method for preparing the oxynitride glass has been known, and there may be mentioned, for example, the following methods. There are a method of using a nitride such as $Si_3N_4$ and AlN as a starting material, a method of bubbling a $N_2$ or $NH_3$ gas in melted glass, a method of melting glass in a reducing gas mainly comprising $N_2$ and Ar gasses and a method of making reducing atmosphere by mixing carbon with a starting material, and these methods can be used in combination. Also, when glass is obtained by a sol-gel method, by subjecting porous gel in an intermediate stage to treatment with $NH_3$ and then heating, the oxynitride glass can be obtained. Similarly, the oxynitride glass can be also obtained by, for example, subjecting porous glass obtained in the course of preparing Vycor glass to treatment with $NH_3$ and then heating. The amount of nitrogen to be introduced varies depending on these methods and a combination thereof. In the oxynitride glass, mechanical characteristics such as strength and toughness are improved as compared with oxide glass into which nitrogen is not introduced, so that the oxynitride glass is convenient for obtaining firm joining. Also, there is an advantage that chemical durability such as alkali resistance is increased.

On the other hand, introduction of nitrogen is accompanied with rise in viscosity and lowering of a thermal expansion coefficient. Therefore, by controlling the amount of nitrogen to be introduced, the characteristics of the oxide glass which is a base can be changed. It is a preferred embodiment of the oxynitride glass that the amount of nitrogen in the glass layer 3 is 0.05 to 7% by weight.

With respect to the crystallized glass layer, a main composition system thereof is not limited, and there may be mentioned, for example, $SiO_2$ type, $SiO_2$—$B_2O_3$ type, $P_2O_5$ type and mixed type crystallized glasses.

By controlling a produced crystal component and selecting a glass composition, crystallized glass having various physical properties can be obtained. The strength of the crystallized glass can be heightened to twice to three times as compared with that of common glass, so that the crystallized glass is suitable for firm joining. However, since joining to the metal plate is carried out, it is not preferred the crystallized glass mostly comprises crystals having a negative thermal expansion coefficient, for example, β-eucryptite ($Li_2O$—$Al_2O_3.2SiO_2$) and aluminum titanate ($Al_2O_3.TiO_2$). Further, not only the crystals of the crystallized glass may be precipitated by heat treatment, but also non-crystalline glass and a crystalline substance may be mixed. As a crystal layer, there may be mentioned cordierite ($2MgO.2Al_2O_3.5SiO_2$), celsian ($BaO.Al_2O_3$—$SiO_2$), anorthite ($CaO.Al_2O_3.2SiO_2$), clinoenstatite ($MgO.SiO_2$), magnesium titanate ($MgO.SiO_2$), forsterite ($2MgO.SiO_2$), wollastonite ($CaO.SiO_2$), quartz ($SiO_2$), tridymite ($SiO_2$), cristobalite ($SiO_2$) and mullite ($3SiO_2.2Al_2O_3$). The ratio of the crystal layer in the whole crystallized glass is not particularly limited, but it is generally 5 to 90% by weight.

The glass layer 3 preferably contains an alkali metal in an amount of 0.01 to 2% by weight calculated on oxide. Here, the reason why the preferred amount to be added is 0.01 to 2% by weight is that if the amount of the alkali metal is too much, chemical durability and electric insulating property of the glass are poor, while if it is too small, the melting temperature of the glass becomes high, and the thermal expansion coefficient becomes too small.

The glass layer 3 preferably contains a transition metal in an amount of 0.01 to 5% by weight calculated on oxide. Such a transition metal is added for the purpose of heightening the joining property of the silicon nitride ceramic plate and the metal plate. Here, the transition metal is preferably titanium, vanadium, chromium, iron, cobalt, manganese, nickel, copper, zirconium or tantalum. The reason why the preferred amount to be added is 0.01 to 5% by weight is that if it is less than 0.01% by weight, an effect of addition is not obtained, while if it exceeds 5% by weight, uniform glass cannot be obtained in some cases.

The glass layer 3 preferably contains aluminum oxide in an amount of 0.02 to 2.5% by weight calculated on oxide. Here, the reason why the amount to be added is 0.02 to 2.5% by weight is that if it is less than 0.02% by weight, the chemical resistance of the glass might be poor, while if it exceeds 2.5% by weight, the thermal conductivity of the substrate is lowered to a value which cannot be ignored due to solid solution to the silicon nitride ceramic plate.

When copper is used as the metal plate, it is preferred to use glass having an average thermal expansion coefficient at room temperature to 300° C. of 7 to $13 \times 10^{-6}/°$ C.; when aluminum is used as the metal plate, it is preferred to glass having an average thermal expansion coefficient at room temperature to 300° C. of 10 to $18 \times 10^{-6}/°$ C.; and when nickel is used as the metal plate, it is preferred to glass having an average thermal expansion coefficient at room temperature to 300° C. of 5 to $10 \times 10^{-6}/°$ C.

As shown in FIG. 1, in the circuit substrate of the present invention, the silicon nitride ceramic plate 1 and the metal plate 2 are joined through the glass layer 3. Here, the thickness of the glass layer 3 after joining to the silicon nitride ceramic plate 1 is preferably 0.1 to 100 μm, more preferably 0.5 to 20 μm. It is preferred that the ratio of the thickness of the silicon nitride ceramic plate 1 to the thickness of the metal plate 2 is set to 1 to 5, and the ratio of the thickness of the metal plate 2 to the thickness of the glass layer 3 is set to 2 to 40.

The semiconductor device of the present invention is a device in which a semiconductor element(s) is mounted on the above silicon nitride circuit substrate. As a particularly representative example utilizing high thermal conductivity thereof, there may be mentioned semiconductor devices which are called power modules, in which a high output semiconductor element, for example, a bipolar transistor, IGBT (Insulated Gate Bipolar Transistor) or GTR (Giant Transistor) is mounted. These semiconductor devices are mainly used for controlling various motors, large electric power switching or the like. Although thermal cycle of heat evolution and cooling of the elements accompanied with driving and stopping of the semiconductor devices is imposed, the devices can cope with such thermal cycle sufficiently by high strength, high thermal conductivity and high reliability which the above silicon nitride circuit substrate possesses. Further, they can be also used for a package for mounting a semiconductor element(s). Additionally, there may be mentioned a leadless chip carrier (LCC), a dual inline package (DIP) and a quad flat package (QFP), a pin grid array (PGA) having a solid structure having many lamination layers, a ball grid array (BGA) and a hybrid package.

The circuit substrate according to the present invention is prepared by the following method. For example, a sintering aid having an average particle size of 0.04 to 1.5 μm and other additives are added to silicon nitride powder containing 0.3 to 2.0% by weight of impurity oxygen, cationic impurities in an amount of 0.4% by weight or less calculated on element and 90% by weight or more of α-phase silicon nitride and having an average particle size of 0.1 to 1.5 μm. To such powder are added an organic binder and an organic solvent, and the mixture is stirred and cracked by using, for example, a ball mill while it is pasted. The paste obtained is formed into a sheet by a doctor blade method or subjected to press molding after removing the organic binder, whereby the paste is adjusted to have a desired shape. Next, the paste is generally heated in non-oxidizing atmosphere such as nitrogen and argon to remove the binder. The highest temperature required for removing the binder is suitably 800° C. or lower in the above non-oxidizing atmosphere and 550° C. or lower in atmosphere containing oxygen. The temperature is generally raised preferably at a rate of 10 to 200° C./h, more preferably at a rate of 30 to 100° C./h.

The sintering aid is selected from an alkaline earth element, a rare earth element, a phosphorus compound, a boron compound and an aluminum compound.

The alkaline earth element and the rare earth element are added in the form of powder or liquid. There may be mentioned, for example, an oxide, a carbide, a fluoride, an oxyfluoride, a carbonate, an oxalate, a nitrate and an alkoxide. Various combinations can be made, for example, chemical powder containing the alkaline earth element and the rare earth element may be added, or the nitrate of the rare earth element is dissolved in alcohol and then added. When the above element is added in the form of powder, its average particle size is preferably 1.0 $\mu$m or less, more preferably 0.6 $\mu$m or less. The alkaline earth element is preferably Ca, Ba, Sr or Mg, more preferably Ca. The rare earth element is preferably Sc, Y or an element of lanthanum series, particularly Y, Ce or La. The amount of the alkaline earth element or the rare earth element to be added is generally 0.2 to 10% by weight, preferably 1.0 to 7.0% by weight calculated on oxide.

As the phosphorus compound, there may be mentioned, for example, $Ca(PO_4)_2$ and a compound of the same chemical formula in which Ca is replaced with Ba or Sr, $YPO_4$ and a compound of the same chemical formula in which Y is replaced with La, Ce, Gd or Yb, $Ca(H_2PO_4)_2$ and $CaHPO_4$ and compounds having the same chemical formulae in which Ca is replaced with Ba or Sr, $AlPO_4$ and $Al(PO_3)_3$.

As the boron compound, there may be mentioned, for example, a boride of an rare earth element such as $LaB_6$, a boride of an alkaline earth element such as $CaB_6$, and a boride of a transition metal such as WB.

As the aluminum compound, there may be mentioned, for example, $Al_2O_3$, a compound which becomes $Al_2O_3$ during sintering, AlN and $AlF_3$. It is effective to add small amounts of these aluminum compounds for improving sintering property.

The amounts of these phosphorus compound, boron compound and aluminum compound are generally 2% by weight or less, preferably 0.8% by weight or less.

As other additive, a transition metal compound may be added mainly for the purpose of coloring or blackening. The transition metal compound may be added in the form of, for example, an oxide, nitride, carbide, oxycarbide or oxynitride of Ti, Nb, Zr, Ta, W, Mo, Cr, Fe, Co or Ni. It is particularly desirable for blackening that the transition metal compound has conductivity. As such a transition metal compound having conductivity, there may be mentioned, for example, a nitride or carbide of Wo, Mo or an element selected from Zr, Ti, Nb and Ta. The amount of the above transition metal compound to be added is preferably 2.5% by weight or less, more preferably 1.0% by weight or less calculated on element.

As the above binder, for example, acryl type, methacryl type and PVB type binders are used. As a solvent in which these binders are to be dispersed, there may be used, for example, an alcohol type solvent such as n-butanol, methyl isobutyl ketone, toluene and xylene. The amount of these binders to be added varies depending on the particle size of AlN powder used, but it is preferably 2 to 45% by weight, more preferably 4 to 20% by weight.

After the binder is removed, the residue is charged into a sintering vessel having less reactivity with silicon nitride such as a vessel made of $Si_3N_4$ ceramics and then sintered at 1,700 to 2,000° C. in non-oxidizing atmosphere containing nitrogen or argon or partially containing hydrogen. Sintering is carried out generally in atmosphere under pressurization of 10 atmospheric pressure or lower, but it is carried out under atmospheric pressure when the sintering temperature is around 1,750° C. With respect to the sintering time, a time of maintaining at the highest temperature is generally 0.5 to 12 hours, preferably 2 to 8 hours. For example, sintering is carried out in nitrogen and/or argon or a mixed gas to which a hydrogen or carbon dioxide gas is partially added thereto as described above, in a sintering vessel made of $Si_3N_4$, BN or carbon in a sintering furnace equipped with a heater made of carbon, tungsten, molybdenum or the like. The amount of oxygen in the atmosphere may be 100 ppm or less. In the sintering step, the temperature may be raised monotonously to the highest temperature, but it may be raised stepwise to the highest temperature, if necessary. The temperature is raised preferably at a rate of 50 to 2,000° C. per hour, more preferably at a rate of 200 to 1,000° C. per hour. The temperature can be lowered at the same rate, but in order to heighten thermal conductivity by crystallizing the grain boundary phase of a sintered body, it is desired to lower the temperature at a rate of 100° C. or less per hour.

By the method as described above, a silicon nitride ceramic plate having a thermal conductivity of 80 W/mK or more and a four point flexural strength at room temperature of 600 Mpa or more can be obtained.

Joining of the metal plate to the silicon nitride ceramic plate obtained is carried out by the following method. First, if necessary, the silicon nitride ceramic plate may be processed, molded and oxidized under heating at 1,000 to 1,400° C. for 2 to 15 hours in atmosphere in which oxygen is present. In this case, the thickness of an oxidized layer is preferably 0.1 to 10 $\mu$m, more preferably in the range of 1 to 5 $\mu$m.

Thereafter, glass is uniformly coated on the ceramic plate. In general, the glass is melted, formed into a shape which can be pulverized easily, by water granulation, a water-cooled roll or the like and then pulverized by, for example, a ball mill to be formed into powder having a desired particle size. This powdery glass is suspended in an organic solvent containing a binder. As the solvent in which the glass is to be suspended, there may be used, for example, an alcohol type solvent such as n-butanol, methyl isobutyl ketone, toluene and xylene. If necessary, by further adding a minute amount of a cellulose such as ethyl cellulose and nitrocellulose, a plasticizer such as dioctyl phthalate, $\alpha$- or $\beta$-terpineol, MIBK (methyl isobutyl ketone), MEK (methyl ethyl ketone), carvenol and the like, suspension property and attachment of a coating film can be improved. This glass suspension may be coated uniformly on the silicon nitride ceramic plate by, for example, a spin coating or dipping method. However, when the glass layer is coated on the sintered body, the glass fills up the concavities and convexities of the sintered body when the glass is softened, so that it is not necessary to pay attention to the surface roughness of the sintered body itself in many cases.

By heating at around the softening point of the glass used, the glass powder is melted while removing the organic solvent and the binder. Next, the formed metal plate is fixed to the glass-coated silicon nitride ceramic plate by using an organic adhesive and heated in non-oxidizing atmosphere at a temperature determined depending on the metal plate and the glass composition used to obtain a joined body. As another means, joining can be carried out by coating the glass powder on the ceramic plate and fixing the metal plate to the ceramic plate without making the glass a coating film, followed by heating. Further, a desired metal plate pattern can be obtained by joining the metal plate which is not processed previously to the ceramic plate and then carrying out etching or the like. As the organic adhesive used for fixing the metal plate to the ceramic plate, any organic adhesive can be used so long as it is easily decomposed and volatilized even in atmosphere containing no oxygen, but in general, a methacrylate type adhesive or the like is used.

The thickness of the glass layer after joining is preferably 0.1 to 100 μm, more preferably 0.5 to 20 μm.

In order to protect the metal plate joined to the silicon nitride ceramic plate and improve electric contact with other electrode, a plating layer such as Ni, Ni—P and Ni—Ag may be formed on the surface of the metal plate. The thickness of the plating layer is desirably about 1 to 6 μm. Plating is formed by an electrolytic or electroless method.

EXAMPLES

The present invention is described in detail by referring to Examples.

Example 1

Step a Preparation of a silicon nitride ceramic plate n-Butanol was added to a powder comprising 96.0% by weight of silicon nitride powder containing 1.3% by weight of impurity oxygen, cationic impurities in an amount of 0.15% by weight calculated on element and 97% by weight of α-phase silicon nitride and having an average particle size of 0.55 μm; 3.5% by weight of $Y_2O_3$ having an average particle size of 0.1 μm and a purity of 99.9% by weight; and 0.5% by weight of $TiO_2$ having an average particle size of 0.5 μm and a purity of 99.9% by weight, and the mixture was cracked and stirred by a wet ball mill. Further, the mixture and an acryl type binder were dispersed in an alcohol type solvent to prepare a slip having a viscosity of about 5,000 CPS. Subsequently, by using this slip, a green sheet having a uniform thickness of about 0.8 mm was prepared by a doctor blade method. Subsequently, the green sheet was cut into a desired size. If necessary, after the sheet was subjected to external shape processing, the sheet was heated to a highest temperature of 700° C. in nitrogen atmosphere to remove the binder. After the binder was removed, the residue was charged into a vessel made of $Si_3N_4$ ceramics and sintered at 1,780° C. for 3 hours under a pressure of 9.8 atmospheric pressure in nitrogen atmosphere by using a sintering furnace having a heater made of carbon. The thickness of the silicon nitride ceramic plate obtained was 0.67 mm.

In order to examine the flexural strength, toughness and thermal conductivity of the silicon nitride ceramic plate, the organic solvent was removed from the same slip as described above, the residue was formed into granulated powder through a mesh of 0.3 mm and subjected to press molding in place of being molded into a sheet. By the same method as described above, the binder was removed, and the powder was subjected to sintering treatment. From the sintered body obtained, a sample bar was cut out and processed. When the sample bar was evaluated by using the four point bending and SEPB (single edge precracked beam) method according to JIS R1601, flexural strength was 770 MPa and toughness was 8.8. From the same sintered body, a disc having a diameter of 10 mm and a thickness of 3.5 mm was cut out. When the thermal conductivity at room temperature of the disc was measured by a laser flash method, it was 92 W/mk.

Step b Preparation of glass to be used for joining

Glass having the following composition was prepared.

| | |
|---|---|
| $SiO_2$ | 75.6 |
| $B_2O_3$ | 18.0 |
| $Al_2O_3$ | 0.5 |
| $Co_3O_4$ | 0.5 |
| $TiO_2$ | 1.5 |
| $Na_2O$ | 0.2 |
| $Li_2O$ | 0.2 |
| CaO | 3.5 (% by weight) |

Here, $H_3BO_3$ was used as a starting material of $B_2O_3$, $NaNO_3$ was used as a starting material of $Na_2O$, $Li_2CO_3$ was used as a starting material of $Li_2O$, and $CaCO_3$ was used as a starting material of CaO. Further, as a defoaming agent, 0.1% by weight of $As_2O_3$ was added based on 100 parts by weight of the above composition. These powders were mixed and then melted in a platinum crucible by an electric furnace. As to the melting conditions, the temperature at which the starting material was thrown batchwisely was 1,300° C., the mixture was maintained at a highest temperature of 1,500° C. for 4 hours, the temperature was then lowered to 1,250° C., and the resulting melt was poured into a water-cooled roller. The glass obtained was pulverized by a ball mill made of alumina for 24 hours to obtain glass powder. Further, a part of the glass melt was poured into a mold made of stainless steel, maintained at 530° C. for 3 hours and then cooled to room temperature over about 30 hours to effect annealing. From the glass block thus obtained, a sample piece was cut out by a diamond cutter, and the average thermal expansion coefficient at room temperature to 300° C. of the sample was measured by a differential dilatometer. The thermal expansion coefficient was $8.3 \times 10^{-6}$.

Step c Preparation of a glass-coated silicon nitride ceramic plate

Next, the $SiO_2$—$B_2O_3$ type oxide glass obtained in Step b was pulverized into a size of 325 mesh or less and then suspended in ethanol. The suspension was coated on the $Si_3N_4$ ceramic plate having a thickness of 0.67 mm obtained in Step a by a spin coating method so as to have a thickness of about 15 μm.

The ceramic plate was heated and maintained at a highest temperature of 830° C. for 30 minutes in dry gas atmosphere having an air composition to obtain a glass-coated silicon nitride ceramic plate.

Step d Joining of the silicon nitride ceramic plate and a metal plate

To the glass-coated silicon nitride ceramic plate obtained in Step c, a copper plate having a thickness of 0.3 mm processed so as to have a predetermined size was temporarily fixed by using a methacrylate type adhesive. Thereafter, in nitrogen atmosphere in which 80 ppm of oxygen was present, the copper plate was joined by heating at a highest temperature of 920° C. for 20 minutes. When the joining strength of the copper/ceramic body of the circuit substrate obtained was evaluated by peel strength, a sufficiently high joining strength of 8.2 kg/cm was obtained. Here, peel strength means a force required for peeling a metal plate having a size of 1 cm joined to a silicon nitride ceramic plate in a right direction rectangular relative to the ceramic plate.

Examples 2 to 10
Step a Preparation of a silicon nitride ceramic plate n-Butanol was added to a powder comprising 95.5% by weight of silicon nitride powder containing 1.4% by weight of impurity oxygen, cationic impurities in an amount of 0.1% by weight or less calculated on element and 96% by weight of α-phase silicon nitride and having an average particle size of 0.48 μm; 3.0% by weight of $Y_2O_3$ having an average particle size of 0.1 μm and a purity of 99.9% by weight; 1.0% by weight of $CeO_2$ having an average particle size of 0.1 μm and a purity of 99.9% by weight; and 0.5% by weight of $WO_3$ having an average particle size of 0.4 μm and a purity of 99.9% by weight, and the mixture was cracked and stirred by a wet ball mill. Further, the mixture and an acryl type binder were dispersed in an alcohol type solvent to prepare a slip having a viscosity of about 5,000 CPS. Subsequently, by using this slip, a green sheet having a uniform thickness of about 0.8 mm was prepared by a doctor blade method. Subsequently, the green sheet was cut into a desired size. If necessary, after the sheet was subjected to external shape processing, the sheet was heated to a highest temperature of 700° C. in nitrogen atmosphere to remove the binder. After the binder was removed, the residue was charged into a vessel made of $Si_3N_4$ ceramics and sintered at 1,850° C. for 6 hours under a pressure of 9.5 atmospheric pressure in nitrogen atmosphere by using a sintering furnace having a heater made of carbon. The thickness of the silicon nitride ceramic plate obtained was 0.66 mm.

As a result of examining the flexural strength, toughness and thermal conductivity of the silicon nitride ceramic plate in the same manner as in Example 1, flexural strength was 810 MPa, toughness was 8.2 and thermal conductivity was 102 W/mK.

Step b Preparation of glasses to be used for joining

Oxide glasses were prepared in the same manner as in Example 1. The specific compositions and average thermal expansion coefficients of the glasses are shown in Table 1.

The alkaline earth oxide was added in the form of carbonate, the alkali metal oxide was added in the form of carbonate or nitrate, and in the same manner as in Example 1, $B_2O_3$ was added in the form of $H_3BO_3$. Also in the same manner as in Example 1, 0.2% by weight of $As_2O_3$ was added to the above composition based on 100 parts by weight thereof.

Step c Preparation of a glass-coated silicon nitride ceramic plate

The silicon nitride ceramic plate obtained was heated at 1,300° C. for 5 hours in atmosphere in which oxygen was present to effect surface oxidation. On the ceramic plate, the glass powders having various compositions obtained in Step b were coated by the same method as in Example 1, respectively.

Step d Joining of the silicon nitride ceramic plates and a metal plate

To the glass-coated silicon nitride ceramic plates obtained in Step c, a tough pitch copper plate having a thickness of 0.3 mm was temporarily fixed by using a methacrylate type adhesive, respectively. Thereafter, in nitrogen atmosphere in which 40 ppm of oxygen was present, the copper plates were joined by heating under a condition of maintaining at 950° C. for 30 minutes. The peel strengths of the circuit substrates obtained thereby are shown in Table 2.

TABLE 2

|  | Example 2 | Example 3 | Example 4 | Example 5 |
|---|---|---|---|---|
| Peel strength | 8.6 | 9.2 | 8.5 | 8.9 |

|  | Example 6 | Example 7 | Example 8 | Example 9 | Example 10 |
|---|---|---|---|---|---|
| Peel strength | 7.8 | 8.6 | 8.5 | 8.6 | 8.8 |

Example 11

Procedures were carried out in the same manner as in Example 1 except for using an aluminum plate having a thickness of 0.3 mm in place of the copper plate and joining

TABLE 1

|  | Example 2 | Example 3 | Example 4 | Example 5 | Example 6 | Example 7 | Example 8 | Example 9 | Example 10 |
|---|---|---|---|---|---|---|---|---|---|
| $SiO_2$ | 78.3 | 76.1 | 59.5 | 72.0 | 76.3 | 78.3 | 74.6 | 74.5 | 76.0 |
| $B_2O_3$ | 18.0 | 19.5 | 17.8 | 21.0 | 16.0 | 16.0 | 20.0 | 18.5 | 18.6 |
| $Co_3O_4$ | 0.5 |  |  | 0.2 | 0.2 |  | 0.2 | 0.2 |  |
| $P_2O_5$ |  |  | 15.1 |  |  |  |  |  |  |
| $Cr_2O_3$ |  | 0.2 |  |  |  |  |  |  |  |
| $V_2O_5$ |  | 0.2 |  |  |  |  |  |  |  |
| $Fe_2O_3$ |  |  | 0.1 |  |  |  |  |  |  |
| NiO |  |  | 0.2 |  |  |  |  |  |  |
| CuO |  |  |  | 0.2 |  |  |  |  |  |
| $ZrO_2$ |  |  |  |  | 0.1 |  |  |  |  |
| $MnO_2$ |  |  |  |  |  | 0.1 |  |  |  |
| $TiO_2$ |  |  |  |  |  | 0.2 |  | 0.1 | 1.5 |
| $Ta_2O_5$ |  |  |  |  |  |  | 0.1 |  |  |
| $Al_2O_3$ | 0.5 | 1.0 | 0.5 | 0.5 | 0.2 | 0.2 | 0.5 | 2.5 | 0.2 |
| $Na_2O$ | 0.2 | 0.3 | 0.3 |  | 0.2 | 0.2 | 0.1 | 0.2 |  |
| $Li_2O$ |  | 0.2 |  | 0.1 |  |  |  |  | 0.2 |
| CaO | 2.5 | 2.5 | 6.5 | 4.5 | 5.5 | 2.5 | 4.5 | 2.5 | 3.5 |
| MgO |  |  |  | 1.5 | 1.5 | 2.5 |  | 1.5 |  |
| Thermal expansion coefficient (× $10^{-6}$) | 7.1 | 8.9 | 12.5 | 8.2 | 9.5 | 8.5 | 9.5 | 7.8 | 8.5 | the aluminum plate to the silicon nitride ceramic plate obtained in Example 1 by using $P_2O_5$—$SiO_2$—$B_2O_3$ type (composition ratio: 67.6/24.9/4.6) oxide glass containing 1.5% by weight of $TiO_2$, 0.5% by weight of $Co_3O_4$, 0.7% by weight of $Al_2O_3$ and 0.2% by weight of an alkali metal oxide ($Na_2O$) and having an average thermal expansion coefficient at room temperature to 300° C. of 15.5×10$^{-6}$/° C. This joining was carried out in dry gas atmosphere having an air composition by heating and maintaining at a highest temperature of 610° C. for 30 minutes. When the joining strength of the aluminum/silicon nitride ceramic body was evaluated by peel strength by the same method as in Example 1, it was 7.5 kg/cm.

Example 12

Procedures were carried out in the same manner as in Example 1 except for using a nickel plate having a thickness of 0.3 mm in place of the copper plate and joining the nickel plate to the silicon nitride ceramic plate obtained in Example 1 by using $P_2O_5$—$SiO_2$—$B_2O_3$ type (composition ratio: 65.6/25.0/6.5) oxide glass containing 1.5% by eight of $TiO_2$, 0.5% by weight of $Co_3O_4$, 0.7% by weight of $Al_2O_3$ and 0.2% by weight of an alkali metal oxide ($Na_2O$) and having an average thermal expansion coefficient at room temperature to 300° C. of 7.5×10$^{-6}$/° C. This joining was carried out in dry gas atmosphere having an air composition by heating and maintaining at a highest temperature of 980° C. for 30 minutes. When the joining strength of the nickel/silicon nitride ceramic body was evaluated by peel strength by the same method as in Example 1, it was 7.5 kg/cm.

Example 13

Step a Preparation of a silicon nitride ceramic plate

A silicon nitride ceramic plate was prepared by the same method as in Example 1.

Step b Preparation of class to be used for joining

By using the following composition as a starting material, oxynitride glass was prepared.

| | |
|---|---|
| $SiO_2$ | 24.3 |
| $Si_3N_4$ | 50.0 |
| $B_2O_3$ | 18.0 |
| AlN | 0.6 |
| $Co_3O_4$ | 0.5 |
| $TiO_2$ | 1.5 |
| $Na_2O$ | 0.2 |
| $Li_2O$ | 0.4 |
| CaO | 4.5 (% by weight) |

In nitrogen atmosphere, this mixed powder was melted in an alumina crucible by an electric furnace. As to the melting conditions, the temperature at which the starting material was thrown batchwisely was 1,200° C., the mixed powder was maintained at a highest temperature of 1,500° C. for 2 hours, the temperature was then lowered to 1,300° C., and the resulting melt was poured into a water-cooled roller. In the same manner as in Example 1, $H_3BO_3$ was used as a starting material of $B_2O_3$, $NaNO_3$ was used as a starting material of $Na_2O$, $Li_2CO_3$ was used as a starting material of $Li_2O$, and $CaCO_3$ was used as a starting material of CaO. The glass obtained was pulverized by a ball mill made of alumina for 24 hours to obtain glass powder. Further, a part of the glass melt was poured into a mold made of stainless steel, maintained at 580° C. for 3 hours and then cooled to room temperature over about 30 hours to effect annealing. From the glass block thus obtained, a sample piece was cut out by a diamond cutter, and by using the sample piece as a sample, the average thermal expansion coefficient at room temperature to 300° C. was measured by a differential dilatometer. The thermal expansion coefficient was 9.3×10$^{-6}$. Further, when the amount of nitrogen contained in the glass powder was measured by a gas analysis method, it was 1.30% by weight.

Step c Preparation of a class-coated silicon nitride ceramic plate

Next, the $SiO_2$—$B_2O_3$ type oxynitride glass obtained in Step b was pulverized into a size of 325 mesh or less and then suspended in ethanol. The suspension was coated on the $Si_3N_4$ ceramic plate having a thickness of 0.67 mm obtained in Step a by a spin coating method.

The ceramic plate was heated and maintained at a highest temperature of 830° C. for 30 minutes in dry gas atmosphere having an air composition to obtain a glass-coated silicon nitride ceramic plate.

Step d Joining of the silicon nitride ceramic plate and a metal plate

To the ceramic plate obtained, a copper plate having a thickness of 0.3 mm processed so as to have a predetermined size was temporarily fixed at a predetermined position by using a methacrylate type adhesive. In nitrogen atmosphere in which 80 ppm of oxygen was present, the copper plate was joined by heating under a condition of maintaining at a highest temperature of 1,150° C. for 5 minutes. When the joining strength of the copper/ceramic body of the circuit substrate obtained was evaluated by peel strength, it was 8.2 kg/cm.

Examples 14 to 22

Step a Preparation of a silicon nitride ceramic plate

A silicon nitride ceramic plate was prepared by the same method as in Example 2.

Step b Preparation of glasses to be used for joining

Oxynitride glasses were prepared in the same manner as in Example 13. The specific compositions and average thermal expansion coefficients of the glasses are shown in Table 3.

TABLE 3

| | Example 14 | Example 15 | Example 16 | Example 17 | Example 18 | Example 19 | Example 20 | Example 21 | Example 22 |
|---|---|---|---|---|---|---|---|---|---|
| $SiO_2$ | 78.3 | 76.2 | 60.3 | 75.5 | 74.8 | 77.8 | 76.6 | 74.9 | 78.3 |
| $B_2O_3$ | 18.0 | 19.5 | 18.5 | 17.5 | 19.5 | 19.0 | 18.5 | 18.6 | 19.0 |
| $P_2O_5$ | | | 15.1 | | | | | | |
| $Ta_2O_5$ | | | | | | | 0.1 | | |
| $Co_3O_4$ | 0.5 | | | 0.2 | 0.2 | | 0.2 | 0.2 | |
| $Cr_2O_3$ | | | | | | | | | |
| $V_2O_5$ | | 0.1 | | | | | | | |
| $Fe_2O_3$ | | | 0.1 | | | | | | |
| NiO | | | 0.2 | | | | | | |
| CuO | | | | | 0.2 | | | | |
| $ZrO_2$ | | | | | | 0.1 | | | |
| $TiO_2$ | | 0.2 | | | | | 0.2 | 0.1 | 1.5 |
| $MnO_2$ | | | | | | 0.1 | | | |

TABLE 3-continued

| | Example 14 | Example 15 | Example 16 | Example 17 | Example 18 | Example 19 | Example 20 | Example 21 | Example 22 |
|---|---|---|---|---|---|---|---|---|---|
| $Al_2O_3$ | 0.5 | 1.0 | 0.5 | 0.5 | 0.2 | 0.2 | 0.5 | 2.5 | 0.2 |
| $Na_2O$ | 0.2 | 0.3 | 0.3 | 0.1 | 0.2 | 0.2 | 0.1 | | 0.2 |
| $Li_2O$ | | 0.2 | | | | | | 0.2 | |
| CaO | 2.5 | 2.5 | 5.0 | 4.5 | 3.5 | 2.5 | 2.5 | 3.5 | |
| MgO | | | | 1.5 | 1.5 | | 1.5 | | |
| Amount of nitrogen (% by weight) | 0.05 | 7.0 | 2.2 | 0.15 | 2.3 | 3.3 | 1.2 | 1.6 | 0.8 |
| Thermal expansion coefficient ($\times 10^{-6}$) | 6.1 | 7.9 | 10.5 | 8.6 | 8.1 | 7.5 | 9.5 | 7.8 | 8.5 |

In Table 3, the compositions are all shown by oxide compositions. By the same method shown in Example 13, $SiO_2$ (a part or all of which was replaced with $Si_3N_4$) and $Al_2O_3$ (a part or all of which was replaced with AlN) are used and are subjected to melting step in nitrogen atmosphere. Since the amount of nitrogen introduced is changed depending on the melting conditions, it is difficult to express it as a component in glass by a chemical formula. Therefore, on the assumption that Si of $Si_3N_4$ is not volatilized, all of the compositions in Table 3 are shown by being calculated on $SiO_2$. The same applies to AlN, and Al in AlN is calculated on $Al_2O_3$.

The alkaline earth oxide was added in the form of carbonate, the alkali metal oxide was added in the form of carbonate or nitrate, and in the same manner as in Example 1, $B_2O_3$ was added in the form of $H_3BO_3$.

Step c Preparation of glass-coated silicon nitride ceramic plates

The silicon nitride ceramic plate obtained in Step a was heated at 1,280° C. for 8 hours in atmosphere in which oxygen was present to effect surface oxidation. On the ceramic plate, the glass powders having various compositions obtained in Step b were coated by the same method as in Example 13, respectively.

Step d Joining of the silicon nitride ceramic plates and a metal plate

To the silicon nitride ceramic plates obtained in Step c, a tough pitch copper plate having a thickness of 0.3 mm was temporarily fixed by using a methacrylate type adhesive, respectively. Thereafter, in nitrogen atmosphere in which 40 ppm of oxygen was present, the copper plates were joined by heating under a condition of maintaining at 950° C. for 30 minutes.

The peel strengths of the circuit substrates obtained are shown in Table 4.

TABLE 4

| | Example 14 | Example 15 | Example 16 | Example 17 |
|---|---|---|---|---|
| Peel strength | 7.8 | 8.5 | 8.9 | 8.7 |

| | Example 18 | Example 19 | Example 20 | Example 21 | Example 22 |
|---|---|---|---|---|---|
| Peel strength | 8.5 | 9.2 | 8.3 | 8.0 | 8.0 |

Example 23

Procedures were carried out in the same manner as in Example 1 except for using an aluminum plate having a thickness of 0.3 mm processed so as to have a predetermined size in place of the copper plate and joining the aluminum plate to the silicon nitride ceramic plate obtained in Example 1 by using $P_2O_5$—$SiO_2$—$B_2O_3$ type (composition ratio: 64.6/26.2/6.3) oxynitride glass containing 2.1% by weight of nitrogen, 1.5% by weight of $TiO_2$, 0.5% by weight of $Co_3O_4$, 0.7% by weight of $Al_2O_3$ and 0.2% by weight of an alkali metal oxide ($Na_2O$) and having an average thermal expansion coefficient at room temperature to 300° C. of $15.5 \times 10^{-6}$/° C. The joining conditions were heating at a highest temperature of 610° C. for 15 minutes in dry gas atmosphere having an air composition. When the joining strength of the aluminum/silicon nitride ceramic body of the circuit substrate obtained was evaluated by peel strength by the same method as in Example 1, it was 7.5 kg/cm.

Example 24

Procedures were carried out in the same manner as in Example 1 except for using a nickel plate having a thickness of 0.3 mm processed so as to have a predetermined size in place of the copper plate and joining the nickel plate to the silicon nitride ceramic plate obtained in Example 1 by using $P_2O_5$—$SiO_2$—$B_2O_3$ type (composition ratio: 64.6/26.2/6.3) oxynitride glass containing 2.6% by weight of nitrogen, 1.5% by weight of $TiO_2$, 0.5% by weight of $Co_3O_4$, 0.7% by weight of $Al_2O_3$ and 0.2% by weight of an alkali metal oxide ($Na_2O$) and having an average thermal expansion coefficient at room temperature to 300° C. of $7.5 \times 10^{-6}$/° C. The joining conditions were heating at a highest temperature of 980° C. for 15 minutes in dry gas atmosphere having an air composition. When the joining strength of the nickel/silicon nitride ceramic body was evaluated by peel strength by the same method as in Example 1, it was 7.5 kg/cm.

Example 25

Step a Preparation of a silicon nitride ceramic plate n-Butanol was added to a powder comprising 95.5% by weight of silicon nitride powder containing 1.1% by weight of impurity oxygen, cationic impurities in an amount of 0.3% by weight or less calculated on element and 96% by weight of α-phase silicon nitride and having an average particle size of 0.46 μm; 3.0% by weight of $Y_2O_3$ having an average particle size of 0.1 μm and a purity of 99.9% by weight; 1.0% by weight of $CeO_2$ having an average particle size of 0.1 μm and a purity of 99.9% by weight; 0.3% by weight of $WO_3$ having an average particle size of 0.4 μm and a purity of 99.9% by weight; and 0.2% by weight of $AlPO_4$ having an average particle size of 0.8 μm and a purity of 99.9% by weight, and the mixture was cracked and stirred by a wet ball mill. Further, the mixture and an acryl type binder were dispersed in an alcohol type solvent to prepare a slip having a viscosity of about 6,000 cPS. Subsequently, by using this slip, a green sheet having a uniform thickness of about 0.81 mm was prepared by a doctor blade method. Subsequently, the green sheet was cut into a desired size. If necessary, after the sheet was subjected to external shape processing, the sheet was heated to a highest temperature of 700° C. in nitrogen atmosphere to remove the binder. After the binder was removed, the residue was charged into a vessel made of $Si_3N_4$ ceramics and sintered at 1,850° C. for 6 hours under a pressure of 5.5 atmospheric pressure in nitrogen atmosphere by using a sintering furnace having a heater made of carbon. The thickness of the silicon nitride ceramic plate obtained was 0.66 mm.

As a result of examining the flexural strength, toughness and thermal conductivity of the silicon nitride ceramic plate in the same manner as in Example 1, flexural strength was 850 MPa, toughness was 8.5 and thermal conductivity was 90 W/mK.

Step b Preparation of glass to be used for joining

From the following mixed composition, crystallized glass was prepared.

| | | |
|---|---|---|
| $SiO_2$ | 68.0 | |
| $B_2O_3$ | 12.0 | |
| $Al_2O_3$ | 0.5 | |
| $Co_3O_4$ | 0.8 | |
| $TiO_2$ | 1.0 | |
| $Na_2O$ | 0.2 | |
| CaO | 11.5 | |
| MgO | 3.5 | |
| BaO | 1.5 | |
| $MnO_2$ | 1.0 | (% by weight) |

Here, $H_3BO_3$ was used as a starting material of $B_2O_3$, $NaNO_3$ was used as a starting material of $Na_2O$, $Li_2CO_3$ was used as a starting material of $Li_2O$, and $CaCO_3$ was used as a starting material of CaO. These powders were mixed, and then the mixture was melted by using alumina in the atmospheric air by an electric furnace. As to the melting conditions, the temperature at which the starting material was thrown batchwisely was 1,300° C., the mixture was maintained at a highest temperature of 1,450° C. for 3 hours, the temperature was then lowered to 1,250° C., and the resulting melt was poured into water to obtain a water-granulated cullet. The cullet obtained was dried and then pulverized by a ball mill made of alumina for 24 hours to obtain glass powder. Further, a part of the glass melt was poured into a mold made of stainless steel, maintained at 530° C. for 3 hours and then cooled to room temperature over about 30 hours to effect annealing. Further, the glass block obtained was heated and maintained at 900° C. for 3 hours to precipitate crystals. When a part of the partially crystallized glass was pulverized and the crystal phase was examined by powder X-ray diffraction, it was found that wollastonite and tridymite were produced. When the amount of the crystal phase was examined from a previously prepared calibration curve, the amount of wollastonite was 21% by weight, and that of tridymite was 17% by weight. From the crystallized glass block, a sample piece was cut out by a diamond cutter, and the average thermal expansion coefficient at room temperature to 300° C. was measured by a differential dilatometer. The thermal expansion coefficient was $8.0 \times 10^{-6}$.

Step c Preparation of a glass-coated silicon nitride ceramic plate

The silicon nitride ceramic plate obtained in Step a was heated at 1,250° C. for 8 hours in atmosphere in which oxygen was present to effect surface oxidation.

Next, the $SiO_2$—$B_2O_3$—CaO—$Al_2O_3$—MnO type crystallized glass obtained in Step b was pulverized into a size of 325 mesh or less and then suspended in ethanol. The suspension was coated on the silicon nitride ceramic plate by a spin coating method. The ceramic plate was heated and maintained at a highest temperature of 1,050° C. for 30 minutes in dry gas atmosphere having an air composition to effect glass coating and crystallization, whereby a crystallized glass-coated silicon nitride ceramic plate was obtained.

Step d Joining of the silicon nitride ceramic plate and a metal plate

To the glass-coated silicon nitride ceramic plate obtained in Step c, a copper plate having a thickness of 0.3 mm processed so as to have a predetermined size was temporarily fixed by using a methacrylate type adhesive. In nitrogen atmosphere in which 65 ppm of oxygen was present, the copper plate was joined by heating under a condition of maintaining at a highest temperature of 1,100° C. for 5 minutes. When the copper/ceramic joining of the circuit substrate obtained was evaluated by peel strength, a sufficiently high joining strength of 8.5 kg/cm was obtained.

Examples 26 to 28

Step a Preparation of a silicon nitride ceramic plate n-Butanol was added to a powder comprising 94.5% by weight of silicon nitride powder containing 1.3% by weight of impurity oxygen, cationic impurities in an amount of 0.15% by weight or less calculated on element and 97% by weight of α-phase silicon nitride and having an average particle size of 0.55 μm; 4.0% by weight of $Y_2O_3$ having an average particle size of 0.1 μm and a purity of 99.9% by weight; $CaCO_3$ having an average particle size of 0.8 μm and a purity of 99.9% by weight in an amount of 1.0% by weight calculated on CaO; and 0.5% by weight of $Al_2O_3$ having an average particle size of 0.4 μm and a purity of 99.9% by weight, and the mixture was cracked and stirred by a wet ball mill. Further, the mixture and an acryl type binder were dispersed in an alcohol type solvent to prepare a slip having a viscosity of about 5,500 CPS. Subsequently, by using this slip, a green sheet having a uniform thickness of about 0.8 mm was prepared by a doctor blade method. Subsequently, the green sheet was cut into a desired size. If necessary, after the sheet was subjected to external shape processing, the sheet was heated to a highest temperature of 700° C. in nitrogen atmosphere to remove the binder. After the binder was removed, the residue was charged into a vessel made of $Si_3N_4$ ceramics and sintered at 1,900° C. for 3 hours under a pressure of 3.5 atmospheric pressure in nitrogen atmosphere by using a sintering furnace having a heater made of carbon. The thickness of the silicon nitride ceramic plate obtained was 0.66 mm.

As a result of examining the flexural strength, toughness and thermal conductivity of the silicon nitride ceramic plate, flexural strength was 880 MPa, toughness was 8.1 and thermal conductivity was 100 W/mK.

Step b Preparation of glasses to be used for joining

Crystallized glasses were prepared in the same manner as in Example 25. The specific compositions and average thermal expansion coefficients of the glasses are shown in Table 5.

TABLE 5

| | Example 26 | Example 27 | Example 28 |
|---|---|---|---|
| $SiO_2$ | 45.8 | 81.2 | 82.0 |
| BaO | 42.0 | | |

TABLE 5-continued

|  | Example 26 | Example 27 | Example 28 |
|---|---|---|---|
| $B_2O_3$ | 5.9 | 6.5 | 5.8 |
| $Co_3O_4$ | 0.6 | 0.1 |  |
| $TiO_2$ |  | 0.2 | 0.1 |
| NiO |  |  | 0.2 |
| $Al_2O_3$ | 0.5 | 1.0 | 0.3 |
| $Na_2O$ | 0.2 | 0.3 | 0.5 |
| $Li_2O$ |  | 0.2 |  |
| CaO | 3.5 | 9.5 | 2.5 |
| MgO | 1.5 |  | 8.6 |
| Crystal phase | celsian | wollastonite tridymite | clinoenstatite |
| Thermal expansion coefficient $\times 10^{-6}$) | 6.1 | 7.9 | 10.5 |

Step c Preparation of a class-coated silicon nitride ceramic plate

The silicon nitride ceramic plate obtained was heated at 1,290° C. for 8 hours in atmosphere in which oxygen was present to effect surface oxidation. To the ceramic plate, the crystallized glass powders having various compositions obtained in Step b were coated by the same method as in Example 1.

Step d Joining of the silicon nitride ceramic plates and a metal plate

To the glass-coated silicon nitride ceramic plates obtained in Step c, a tough pitch copper plate having a thickness of 0.3 mm was temporarily fixed by using a methacrylate type adhesive, respectively. Thereafter, in nitrogen atmosphere in which 40 ppm of oxygen was present, the copper plates were joined by heating under a condition of maintaining at 950° C. for 30 minutes. The peel strengths of the circuit substrates obtained thereby are shown in Table 6.

TABLE 6

|  | Example 26 | Example 27 | Example 28 |
|---|---|---|---|
| Peel strength | 8.6 | 8.7 | 8.5 |

Example 29

Procedures were carried out by the same method as in Example 1 except for using an aluminum plate having a thickness of 0.3 mm in place of the copper plate and joining the aluminum plate to the silicon nitride ceramic plate obtained in Example 1. That is, an aluminum plate having a thickness of 0.3 mm processed so as to have a predetermined size was joined to the silicon nitride ceramic plate by heating and maintaining at a highest temperature of 610° C. for 15 minutes in dry gas atmosphere having an air composition, by using $PbO$—$ZnO$—$B_2O_3$ type mixed powder of glass and crystals, comprising 65% by weight of glass containing 2.1% by weight of nitrogen, 1.5% by weight of $TiO_2$, 0.5% by weight of $Co_3O_4$, 0.7% by weight of $Al_2O_3$ and 0.2% by weight of an alkali metal oxide ($Na_2O$) and having an average thermal expansion coefficient at room temperature to 300° C. of $15.5 \times 10^{-6}/°$ C.; 15% by weight of tridymite having an average particle size of 1.5 μm; and 20% by weight of magnesium titanate having an average particle size of 1.1 μm. When the joining strength of the aluminum/silicon nitride ceramic body of the circuit substrate obtained was evaluated by peel strength by the same method as in example 1, it was 7.8 kg/cm.

Comparative Example 1

A silicon nitride ceramic plate having a thickness of 0.67 mm prepared by using the same composition and the same preparation method as in Example 1 was heated at 1,300° C. for 12 hours in a dry gas having an air composition to form an oxidized layer having a thickness of about 2 μm. By using the same material and the same method as in Example 1 except for using no glass layer, the copper plate was joined to the oxidized layer. When the joining strength of the circuit substrate obtained was measured in the same manner, it was 2.1 kg/cm and did not reach to 5 kg/mm² which is considered to be strength for practical use, so that the circuit substrate could not be provided for practical use.

Example 30

Figure 2:
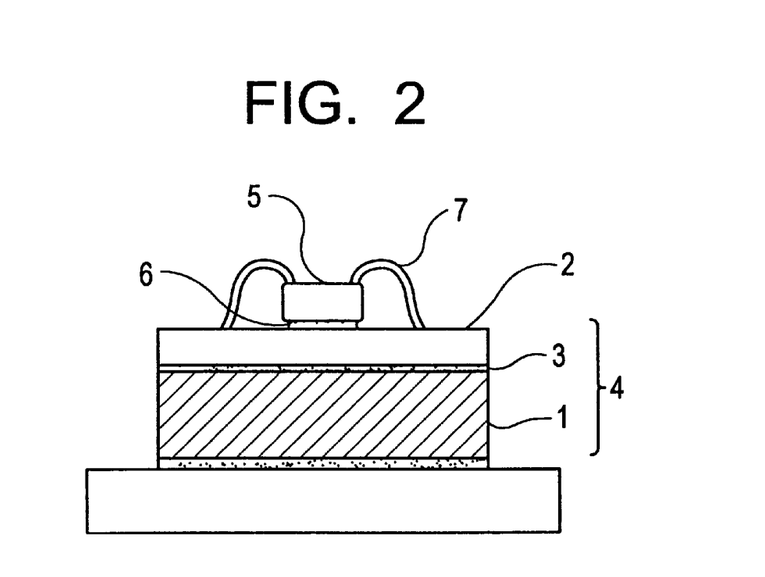
FIG. 2 is a sectional view of a semiconductor device using a silicon nitride ceramic circuit substrate.

A power transistor (an semiconductor element) was mounted, by a soldering layer, on the metal plates of the respective silicon nitride ceramic circuit substrates obtained in Examples 1, 13 and 25 and connected to the terminal portions of the metal plates with a bonding wire, respectively to prepare semiconductor devices using the silicon nitride ceramic substrate. A conceptional view thereof is shown in FIG. 2 in which 1 is a silicon nitride ceramic plate, 2 is a metal plate, 3 is a glass layer, 4 is a silicon nitride ceramic circuit substrate, 5 is a power transistor, 6 is a soldering layer and 7 is a wire bonding.

When electricity was passed through the semiconductor devices obtained and each transient heat resistance was measured, it was confirmed that the semiconductor devices exhibited sufficient radiation property, cracks at the ceramic portions were not generated, and the devices had excellent durability and reliability.

We claim:

1. A circuit substrate which comprises a silicon nitride ceramic plate having a thermal conductivity at room temperature of 80 W/mK or more and a metal plate joined through a glass layer to the silicon nitride ceramic plate, wherein said glass layer contains an alkali metal in an amount of 0.01 to 2% by weight calculated on oxide.

2. The substrate according to claim 1, wherein the glass layer is an oxide glass layer.

3. The substrate according to claim 1, wherein the glass layer is an oxynitride glass layer containing 0.05 to 7% by weight of nitrogen.

4. The substrate according to claim 1, wherein the glass layer is a crystallized glass layer.

5. The substrate according to claim 1, wherein the glass layer contains an alkali metal in an amount of 0.01 to 2% by weight calculated on oxide.

6. The substrate according to claim 1, wherein the glass layer contains 0.01 to 5% by weight calculated on oxide of a transition metal.

7. The substrate according to claim 1, wherein the glass layer contains 0.02 to 2.5% by weight calculated on oxide of aluminum oxide.

8. The substrate according to claim 6, wherein the transition metal is titanium, vanadium, chromium, iron, cobalt, manganese, nickel, copper, zirconium or tantalum.

9. The substrate according to claim 1, wherein the metal plate comprises copper, and the glass has an average thermal expansion coefficient at room temperature to 300° C. of 7 to $13 \times 10^{-6}/°$ C.

10. The substrate according to claim 1, wherein the metal plate comprises aluminum, and the glass has an average thermal expansion coefficient at room temperature to 300° C. of 10 to $18 \times 10^{-6}/°$ C.

11. The substrate according to claim 1, wherein the metal plate comprises nickel, and the glass has an average thermal expansion coefficient at room temperature to 300° C. of 5 to $10 \times 10^{-6}/°$ C.

12. The substrate according to claim 1, wherein the thickness ratio of the silicon nitride ceramic plate/the metal plate is 5 to 1, and the thickness ratio of the metal plate/the glass layer is 2 to 40.

13. The substrate according to claim 1, wherein the silicon nitride ceramic plate is obtained by heating in non-oxidizing atmosphere.

14. The substrate according to claim 1, wherein the glass layer is obtained by heating a glass suspension coated on the silicon nitride ceramic plate by a spin coating method.

15. The substrate according to claim 1, wherein the glass layer is obtained by heating a glass suspension coated on the silicon nitride ceramic plate by a dipping method.

16. A circuit substrate which comprises a silicon nitride ceramic plate having a thermal conductivity at room temperature of 80 W/mK or more and a metal plate comprising aluminum joined through a glass layer to the silicon nitride ceramic plate, wherein said glass layer contains an alkali metal in an amount of 0.01 to 2% by weight calculated on oxide, and wherein the glass has an average thermal expansion coefficient at room temperature to 300° C. of 10 to $18 \times 10^{-6}$/° C.

17. A circuit substrate which comprises a silicon nitride ceramic plate having a thermal conductivity at room temperature of 80 W/mK or more and a metal plate joined through a glass layer to the silicon nitride ceramic plate, wherein said glass layer contains an alkali metal in an amount of 0.01 to 2% by weight calculated on oxide, and wherein the glass layer is a crystallized glass layer.

18. The substrate according to claim 17, wherein the glass layer contains 0.01 to 5% by weight of a transition metal calculated on oxide.

* * * * *